(12) United States Patent
Chang

(10) Patent No.: US 8,063,444 B2
(45) Date of Patent: Nov. 22, 2011

(54) LATERAL DIFFUSED METAL OXIDE SEMICONDUCTOR (LDMOS) DEVICES WITH ELECTROSTATIC DISCHARGE (ESD) PROTECTION CAPABILITY IN INTEGRATED CIRCUIT

(75) Inventor: Yih-Jau Chang, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 306 days.

(21) Appl. No.: 12/426,151

(22) Filed: Apr. 17, 2009

(65) Prior Publication Data

US 2010/0148256 A1    Jun. 17, 2010

(30) Foreign Application Priority Data

Dec. 17, 2008    (TW) ................. 97149113 A

(51) Int. Cl.
*H01L 29/66* (2006.01)
(52) U.S. Cl. ............... 257/343; 257/401; 257/E29.261; 257/E27.06
(58) Field of Classification Search .............. 257/409, 257/E27.06, E29.261, 401, 495, E29.338, 257/E29.342, E29.318, E29.262, 343
See application file for complete search history.

(56) References Cited

U.S. PATENT DOCUMENTS

| 6,395,591 | B1 * | 5/2002 | McCormack et al. | 438/199 |
| 6,933,559 | B1 * | 8/2005 | Van Roijen et al. | 257/328 |
| 2006/0124994 | A1 * | 6/2006 | Jang et al. | 257/328 |
| 2007/0007591 | A1 * | 1/2007 | Theeuwen et al. | 257/340 |

OTHER PUBLICATIONS

Liu, Y.Q. et al., "Improving the ESD Performance of LDMOS Device with New NBL," Electronic Product Reliability and Enviromental Testing, Jun. 30, 2008, pp. 9-14, vol. 26, No. 3, China.
Ming-Dou Ker et al., "Double Snapback Characteristics in High-Voltage nMOSFETs and the Impact to On-Chip ESD Protection Design," IEEE Electron Device Letters, Sep. 30, 2004, pp. 12-14, vol. 25, No. 9, IEEE, US.

* cited by examiner

*Primary Examiner* — Caridad Everhart

(57) ABSTRACT

Lateral diffused metal oxide semiconductor (LDMOS) devices with electrostatic discharge (ESD) protection capability are presented for integrated circuits. The LDMOS device includes a semiconductor substrate with an epi-layer thereon. Patterned isolations are disposed on the epi-layer, thereby defining a first active region and a second active region. An N-type double diffused drain (NDDD) region is formed in the first active region and a N$^+$ doped drain region is disposed in the NDDD region. A P-body diffused region is formed in the second active region, wherein the NDDD region and the P-body diffused region are separated with a predetermined distance exposing the epi-layer. An N$^+$ doped source region and a P$^+$ diffused region are disposed in the P-body diffused region. A gate structure is disposed between the N$^+$ doped source region and the N$^+$ doped drain region. An additional heavily doped region is formed between the semiconductor and the epi-layer. The punch-through voltage or the breakdown voltage of the interface can be adapted by regulating the P+ or N+ dosage to exceed the breakdown voltage of the LDNMOS transistor or the LDPMOS transistor. It can be able to effectively reduce the breakdown voltage or the punch-through voltage relative to the semiconductor substrate under the drain region, thus increasing ESD protection.

22 Claims, 4 Drawing Sheets

LATERAL DIFFUSED METAL OXIDE SEMICONDUCTOR (LDMOS) DEVICES WITH ELECTROSTATIC DISCHARGE (ESD) PROTECTION CAPABILITY IN INTEGRATED CIRCUIT

CROSS REFERENCE TO RELATED APPLICATIONS

This application is based upon and claims the benefit of priority from a prior Taiwanese Patent Application No. 097149113, filed on Dec. 17, 2008, the entire contents of which are incorporated herein by reference.

BACKGROUND OF THE INVENTION

1. Field of the Invention

The invention relates to high voltage semiconductor devices, and in particular, to lateral diffused metal oxide semiconductor (LDMOS) devices with electrostatic discharge (ESD) protection capability.

2. Description of the Related Art

In conventional integrated circuits, LDMOS transistors are vulnerable to high-voltage (HV) electrostatic discharge damage. This is mainly because the gate oxide layer of the LDMOS transistor is close to drain region, and further away from the source/body diffusion regions. Thus, when the ESD current travels from the drain end of the transistor, the energy of the ESD current tends to distribute towards the gate oxide layer, rather than flow towards the source/body diffusion regions, resulting in break down of the gate oxide.

In the conventional integrated circuits with HV devices, other additional ESD protection components are often adopted to avoid LDMOS transistor components from breaking down. However, the additional ESD protection components increase occupied space of the integrated circuit, and increase the complexity of fabrication thereof, resulting in higher manufacturing costs. Accordingly, a modified lateral diffused metal-oxide semiconductor transistor (LDMOS) device structure with excellent electrostatic discharge (ESD) protection capability is desired.

BRIEF SUMMARY OF THE INVENTION

Accordingly, in order to overcome the abovementioned shortcomings, various structures of LDMOS transistors are provided to respectively reduce breakdown voltage between the drain and base or punch-through voltage of LDNMOS devices or LDPMOS devices such that ESD current is allowed to distribute towards the substrate, rather than flow towards the gate oxide layer region.

An embodiment of the invention provides a lateral diffused N-type metal oxide semiconductor (LDNMOS) device with electrostatic discharge (ESD) protection capability, comprising: a semiconductor substrate with an epi-layer thereon; patterned isolations disposed on the epi-layer, thereby defining a first active region and a second active region; an N-type double diffused drain (NDDD) region formed in the first active region; an $N^+$ heavily doped drain region disposed in the NDDD region; a P-body diffused region formed in the second active region, wherein the NDDD region and the P-body diffused region are separated with a predetermined distance exposing the epi-layer; a neighboring pair of an $N^+$ heavily doped and a $P^+$ heavily doped source region disposed in the P-body diffused region; and a gate structure is disposed between the $N^+$ heavily doped source region and the $N^+$ heavily doped drain region, wherein an additional heavily doped region is formed between the semiconductor substrate and the epi-layer.

Another embodiment of the invention provides a lateral diffused P-type metal oxide semiconductor (LDPMOS) device with electrostatic discharge (ESD) protection capability, comprising: a semiconductor substrate with an epi-layer thereon; patterned isolations disposed on the epi-layer, thereby defining an active region; a P-type double diffused drain (PDDD) region formed in the active region; a $P^+$ heavily doped drain region disposed in the PDDD region; a neighboring pair of an $N^+$ heavily doped and a $P^+$ heavily doped source region disposed in the epi-layer; and a gate structure is disposed between the $P^+$ heavily doped source region and the $P^+$ heavily doped drain region, wherein an additional heavily doped region is formed between the semiconductor substrate and the epi-layer.

Another embodiment of the invention provides a lateral diffused N-type metal oxide semiconductor (LDNMOS) device with electrostatic discharge (ESD) protection capability, comprising: a semiconductor substrate with an epi-layer thereon; patterned isolations disposed on the epi-layer, thereby defining an active region; an N-type double diffused drain (NDDD) region formed in the active region; an $N^+$ heavily doped drain region disposed in the NDDD region; a neighboring pair of an $N^+$ heavily doped and a $P^+$ heavily doped source region disposed in the epi-layer; and a gate structure is disposed between the $N^+$ heavily doped source region and the $N^+$ heavily doped drain region, wherein an additional heavily doped region is formed between the semiconductor substrate and the epi-layer.

Another embodiment of the invention provides a lateral diffused P-type metal oxide semiconductor (LDPMOS) device with electrostatic discharge (ESD) protection capability, comprising: a semiconductor substrate with an epi-layer thereon; a buried layer disposed between the semiconductor substrate and the epi-layer; patterned isolations disposed on the epi-layer, thereby defining a first active region and a second active region; a P-type double diffused drain (PDDD) region formed in the first active region; a $P^+$ heavily doped drain region disposed in the PDDD region; an N-body diffused region formed in the second active region, wherein the PDDD region and the N-body diffused region are separated with a predetermined distance exposing the semiconductor substrate; a neighboring pair of an $N^+$ heavily doped and a $P^+$ heavily doped source region disposed in the N-body diffused region; and a gate structure is disposed between the $P^+$ heavily doped source region and the $P^+$ heavily doped drain region, wherein an additional heavily doped region is formed between the semiconductor substrate and the epi-layer.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
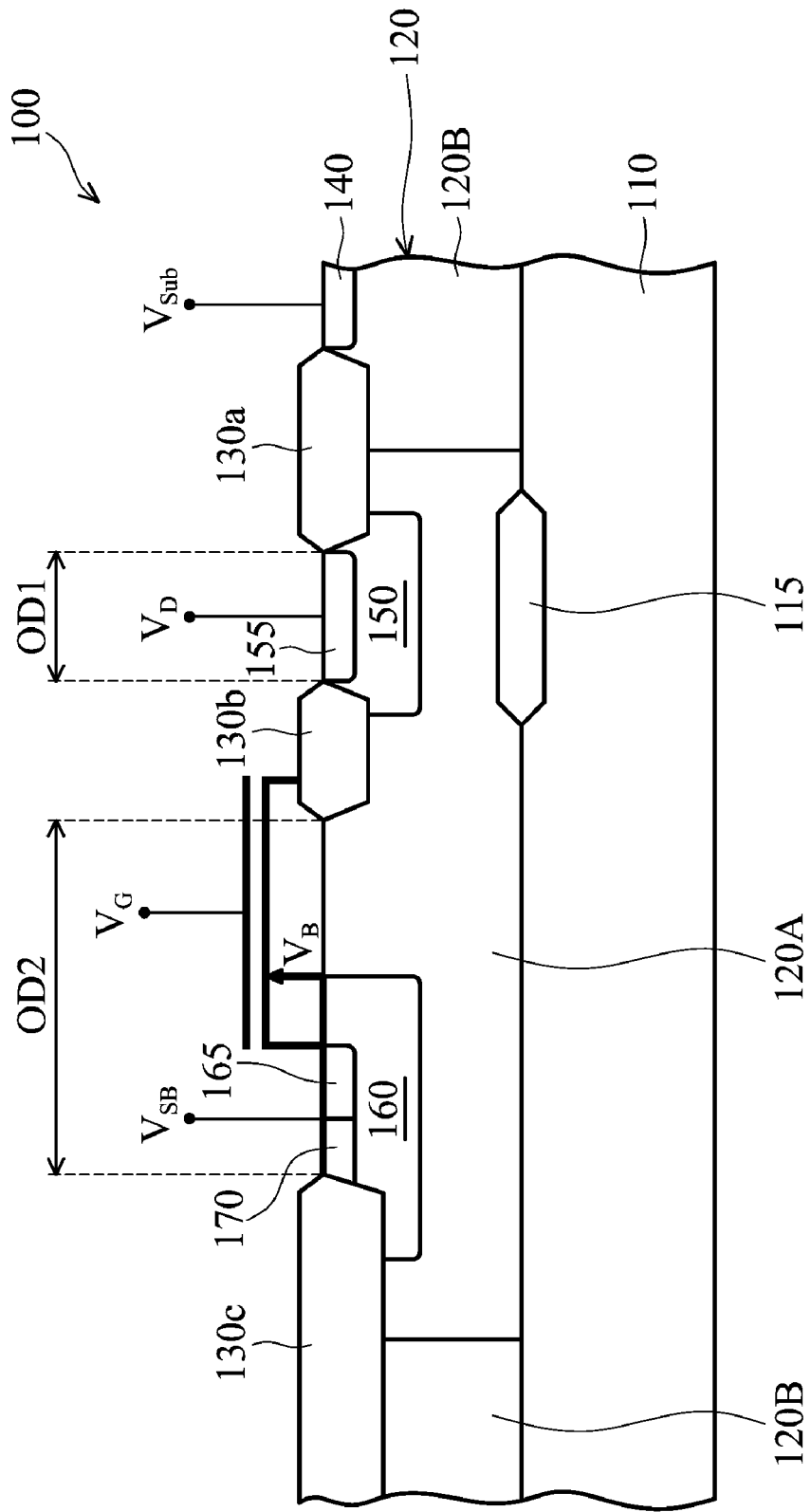
FIG. 1 is a schematic cross section of an embodiment of the LDNMOS transistor device of the invention.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

FIG. 1 is a schematic cross section of an embodiment of the LDNMOS transistor device of the invention. In FIG. 1, an LDNMOS transistor device 100 with ESD protection capability includes a semiconductor substrate 110 such as a P-type silicon substrate with an epitaxial layer (epi-layer) 120 thereon. The epi-layer 120 includes a high voltage N-well (HVNW) region 120A enclosed by a high voltage P-well (HVPW) region 120B. The surface of the high voltage P-well (HVPW) region 120B includes a P$^+$ heavily diffused region 140. An additional heavily doped region 115 is formed on the interface between the semiconductor substrate 110 and the epi-layer 120 (or the high voltage N-well (HVNW) region 120A). According to one embodiment, the additional heavily doped region 115 includes an N$^+$ heavily doped region or a P$^+$ heavily doped region, wherein a position of the additional heavily doped region 115 is corresponding to a position of the NDDD region 150.

Patterned isolations 130a-130c are disposed on the epi-layer 120, thereby defining a first active region OD1 and a second active region OD2. An N-type double diffused drain (NDDD) region 150 is formed in the first active region OD1. An N$^+$ heavily doped drain region 155 is disposed in the NDDD region 150. A P-body diffused region 160 is formed in the second active region OD2, wherein the NDDD region 150 and the P-body diffused region 160 are separated with a predetermined distance exposing the semiconductor substrate. A neighboring pair of an N$^+$ heavily doped and a P$^+$ heavily doped source regions 165 and 170 are disposed in the P-body diffused region 160, and a gate structure is disposed between the N$^+$ heavily doped source region and the N$^+$ heavily doped drain region.

When ESD testing or real zapping applied in the drain end. The additional heavily doped region 115 effectively reduces the breakdown voltage of the N$^+$/NDDD/HVNW relative to the P-type substrate under the drain region, such that most of the electrostatic charge is distributed to the P-type semiconductor substrate to enhance ESD protection.

Figure 2:
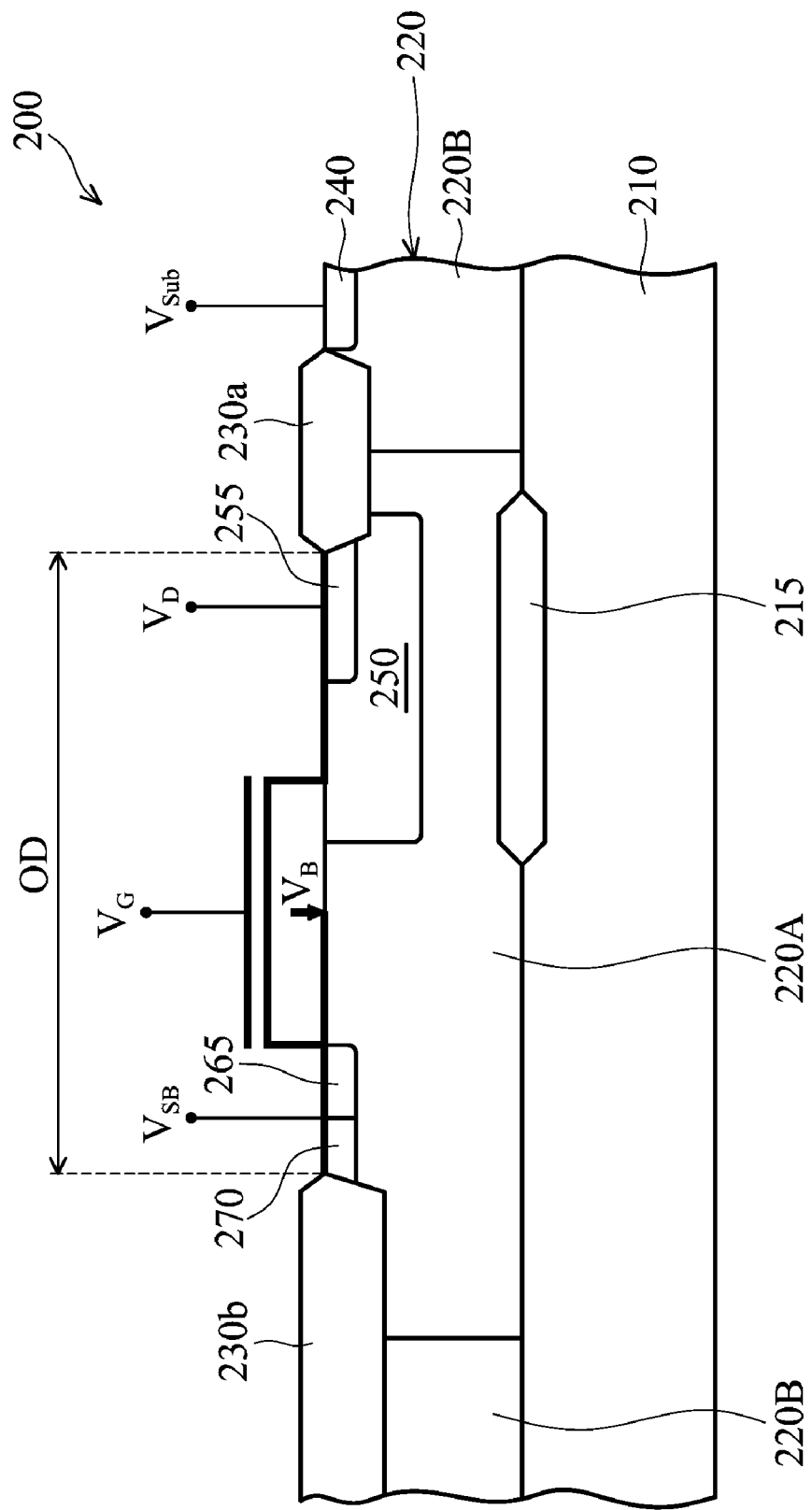
FIG. 2 is a schematic cross section of another embodiment of the LDPMOS transistor device of the invention.

FIG. 2 is a schematic cross section of another embodiment of the LDPMOS transistor device of the invention. In FIG. 2, an LDPMOS transistor device 200 with ESD protection capability includes a semiconductor substrate 210 such as a P-type silicon substrate with an epitaxial layer (epi-layer) 220 thereon. The epi-layer 220 includes a high voltage N-well (HVNW) region 220A enclosed by a high voltage P-well (HVPW) region 220B. The surface of the high voltage P-well (HVPW) region 220B includes a P$^+$ heavily diffused region 240. According to one embodiment, an additional heavily doped region 215 is formed on the interface between the semiconductor substrate 210 and the epi-layer 220 (or the high voltage N-well (HVNW) region 220A). The additional heavily doped region 215 includes an N$^+$ heavily doped region or a P$^+$ heavily doped region, wherein a position of the additional heavily doped region 215 is corresponding to a position of the PDDD region 250.

Patterned isolations 230a and 230b are disposed on the epi-layer 220, thereby defining an active region OD. A P-type double diffused drain (PDDD) region 250 is formed in the active region OD. A P$^+$ heavily doped drain region 255 is disposed in the PDDD region 250. A neighboring pair of a P$^+$ heavily doped and an N$^+$ heavily doped source region 265 and 270 are disposed in the HVNW region 220A, and a gate structure is disposed between the P$^+$ heavily doped source region and the P$^+$ heavily doped drain region.

Similar to the abovementioned embodiment of LDNMOS structures 100, the additional heavily doped region 215 of the LDPMOS structure 200 can effectively reduce the breakdown voltage or the punch-through voltage of the P$^+$/PDDD/HVNW relative to the P-type substrate under the drain region. Thus, most of the electrostatic charge is distributed to the P-type semiconductor substrate instead of flowing towards the source/body diffused regions, effectively preventing damage to the gate oxide layer.

Figure 3:
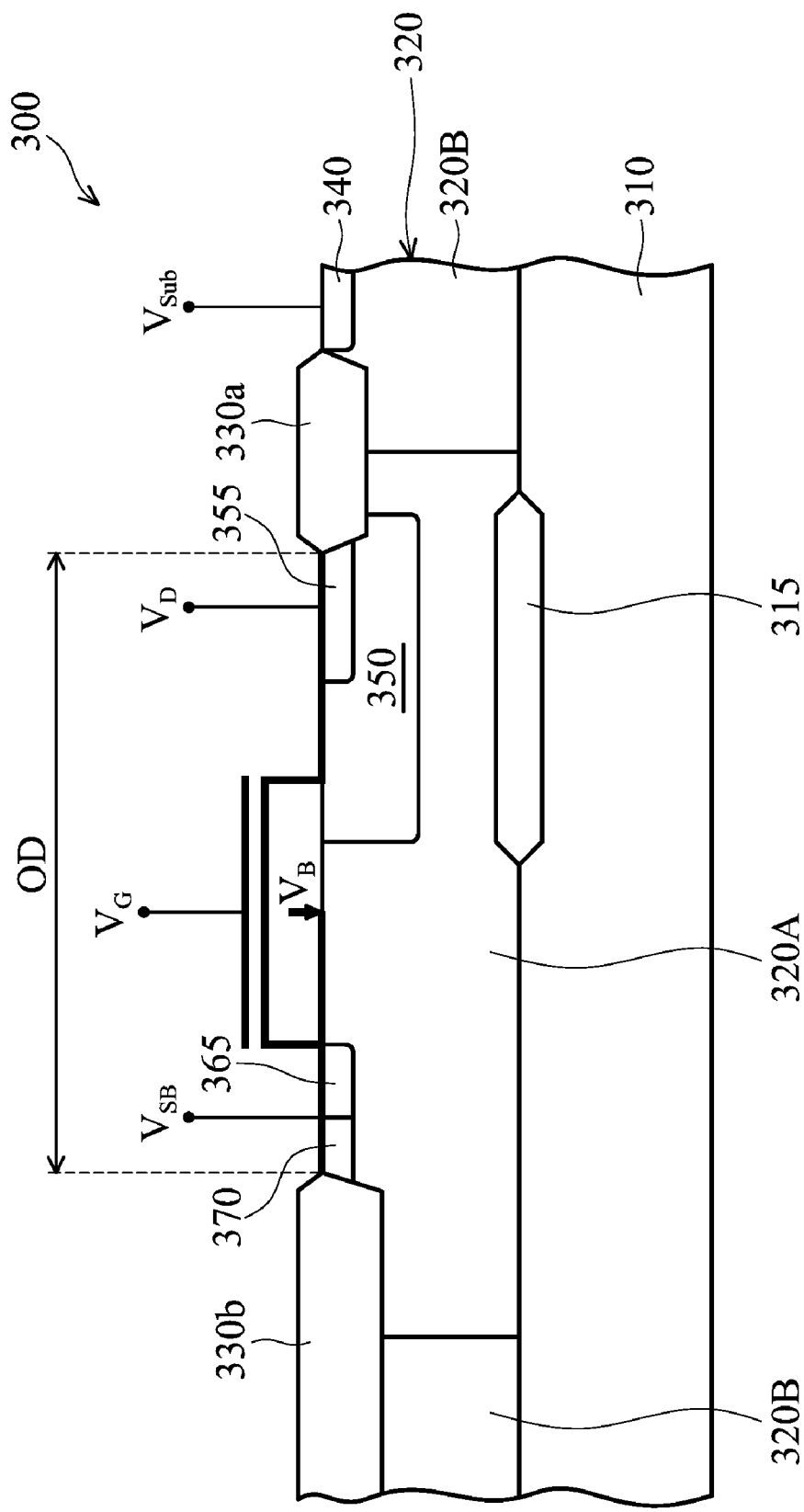
FIG. 3 is a schematic cross section of another embodiment of the LDNMOS transistor device of the invention.

FIG. 3 is a schematic cross section of another embodiment of the LDNMOS transistor device of the invention. In FIG. 3, an LDNMOS transistor device 300 with ESD protection capability includes a semiconductor substrate 310 such as an N-type silicon substrate with an epi-layer 320 thereon. The epi-layer 320 includes a high voltage P-well (HVPW) region 320A enclosed by a high voltage N-well (HVNW) region 320B. The surface of the high voltage N-well (HVNW) region 320B includes an N$^+$ heavily diffused region 340. According to one embodiment, an additional heavily doped region 315 is formed on the interface between the semiconductor substrate 310 and the epi-layer 320 (or the high voltage P-well (HVPW) region 320A). The additional heavily doped region 315 includes an N$^+$ heavily doped region or a P$^+$ heavily doped region, wherein a position of the additional heavily doped region 315 is corresponding to a position of the NDDD region 350. Patterned isolations 330a and 330b are disposed on the epi-layer 320, thereby defining an active region OD. An N-type double diffused drain (NDDD) region 350 is formed in the active region OD. An N$^+$ heavily doped drain region 355 is disposed in the NDDD region 350. A neighboring pair of an N$^+$ heavily doped and a P$^+$ heavily doped source region 365 and 370 are disposed in the HVPW region 320A, and a gate structure is disposed between the N$^+$ heavily doped source region and the N$^+$ heavily doped drain region. As to the LDNMOS structure 300, the additional heavily doped region 315 between the semiconductor substrate 310 and the HVPW region 320A can effectively reduce the breakdown voltage or the punch-through voltage of the N$^+$/NDDD/HVPW relative to the N-type substrate under the drain region. Thus, most of the electrostatic charge is distributed to the N-type semiconductor substrate instead of flowing towards the source/body diffused regions, effectively preventing damage to the gate oxide layer.

Figure 4:
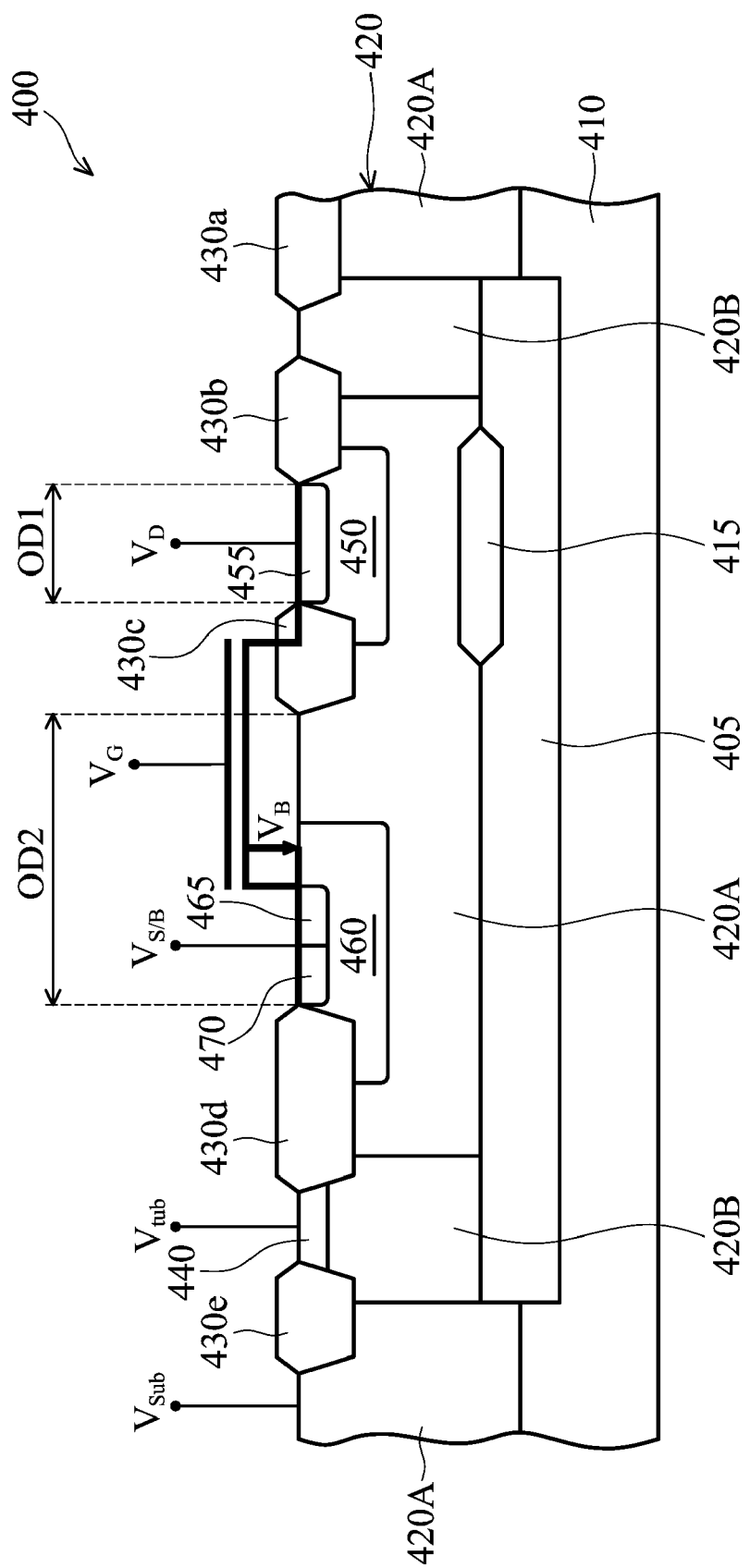
FIG. 4 is a schematic cross section of another embodiment of the LDPMOS transistor device of the invention.

FIG. 4 is a schematic cross section of another embodiment of the LDPMOS transistor device of the invention. Referring to FIG. 4, an LDPMOS transistor device 400 with ESD protection capability includes a semiconductor substrate 410 such as a P-type silicon substrate with an epi-layer 420 thereon. The epi-layer 420 includes a high voltage P-well (HVPW) region 420A enclosed by a high voltage N-well (HVNW) region 420B. The surface of the high voltage N-well (HVNW) region 420B includes an N$^+$ heavily diffused region 440. An N-type buried layer (NBL) 405 is interposed between the semiconductor substrate 410 and the HVPW region 420A. An additional heavily doped region 415 is formed on the interface between the semiconductor substrate 410 and the N-type buried layer 405. According to one embodiment, the additional heavily doped region 415 includes an N+ heavily doped region or a P+ heavily doped region, wherein a position of the additional heavily doped region 415 is corresponding to a position of the PDDD region 450.

Patterned isolations 430a-430e are disposed on the epi-layer 420, thereby defining a first active region OD1 and a second active region OD2. A P-type double diffused drain (PDDD) region 450 is formed in the first active region OD1. A P+ heavily doped drain region 455 is disposed in the PDDD region 450. An N-body diffused region 460 is formed in the second active region OD2, wherein the PDDD region 450 and the N-body diffused region 460 are separated with a predetermined distance exposing the semiconductor substrate. A neighboring pair of a P+ heavily doped and an N+ heavily doped source region 465 and 470 are disposed in the N-body diffused region 460, and a gate structure is disposed between the P+ heavily doped source region and the P+ heavily doped drain region.

In FIG. 4, the LDPMOS structure 400 adopts a similar configuration to the abovementioned embodiments. The additional heavily doped region 415, including an N+ heavily doped region or a P+ heavily doped region, can effectively reduce the breakdown voltage of the P+/PDDD/HVPW relative to the P-type substrate under the drain region. Furthermore, it also has the same capability to prevent electrostatic discharge effect.

In an embodiment of the integrated circuit, no matter which of the LDMOS structure of the embodiments of the invention is adopted, the additional heavily doped region, including an N+ heavily doped region or a P+ heavily doped region, in the interface between the semiconductor substrate and the epi-layer is, but not limited thereto, able to effectively reduce the breakdown voltage or the punch-through voltage relative to the semiconductor substrate under the drain region, thus increasing ESD protection.

Note that each of the abovementioned embodiments, capable of ESD protection, of the LDNMOS and the LDPMOS structures is merely illustrated for description, and is not limited thereto. Other various examples may be applied, for example in the LDPMOS transistor of FIG. 2, the source can serve as an output component of the integrated circuit. Therefore, P+ dopants and N+ dopants would be implanted in the interface between the P-type semiconductor substrate and the HVNW region under the drain region by using well-known or additional ion-implantation processes. Moreover, the punch-through voltage or the breakdown voltage of the interface can be adapted by regulating the P+ or N+ dosage to exceed the breakdown voltage of the LDNMOS transistor or the LDPMOS transistor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral diffused N-type metal oxide semiconductor (LDNMOS) device with electrostatic discharge (ESD) protection capability, comprising:
    a semiconductor substrate with an epi-layer thereon;
    patterned isolations disposed on the epi-layer, thereby defining a first active region and a second active region;
    an N-type double diffused drain (NDDD) region formed in the first active region;
    an N+ heavily doped drain region disposed in the NDDD region;
    a P-body diffused region formed in the second active region, wherein the NDDD region and the P-body diffused region are separated with a predetermined distance exposing the epi-layer;
    a neighboring pair of an N+ heavily doped and a P+ heavily doped source region disposed in the P-body diffused region; and
    a gate structure is disposed between the N+ heavily doped source region and the N+ heavily doped drain region,
    wherein an additional heavily doped region is formed between the semiconductor substrate and the epi-layer, and wherein a position of the additional heavily doped region is corresponding to a position of the NDDD region, and not the N+ heavily doped and a P+ heavily doped source region.

2. The LDNMOS device as claimed in claim 1, wherein the additional heavily doped region includes an N+ heavily doped region or a P+ heavily doped region.

3. The LDNMOS device as claimed in claim 1, wherein a breakdown voltage on an interface between the additional heavily doped region and the semiconductor substrate or the epi-layer is greater than a breakdown voltage of the LDMOS device.

4. The LDNMOS device as claimed in claim 1, wherein the semiconductor substrate is a P-type semiconductor substrate, and the epi-layer includes a high voltage N-well region enclosed by a high voltage P-well region.

5. The LDNMOS device as claimed in claim 4, wherein a surface of the high voltage P-well region includes a P+ heavily diffused region.

6. A lateral diffused P-type metal oxide semiconductor (LDPMOS) device with electrostatic discharge (ESD) protection capability, comprising:
    a semiconductor substrate with an epi-layer thereon;
    patterned isolations disposed on the epi-layer, thereby defining an active region;
    a P-type double diffused drain (PDDD) region formed in the active region;
    a P+ heavily doped drain region disposed in the PDDD region;
    a neighboring pair of an N+ heavily doped and a P+ heavily doped source region disposed in the epi-layer; and
    a gate structure is disposed between the P+ heavily doped source region and the P+ heavily doped drain region,
    wherein an additional heavily doped region is formed between the semiconductor substrate and the epi-layer, and wherein a position of the additional heavily doped region is corresponding to a position of the PDDD region, and not the N+ heavily doped and a P+ heavily doped source region.

7. The LDPMOS device as claimed in claim 6, wherein the additional heavily doped region includes an N+ heavily doped region or a P+ heavily doped region.

8. The LDPMOS device as claimed in claim 6, wherein a breakdown voltage on an interface between the additional heavily doped region and the semiconductor substrate or the epi-layer is greater than a breakdown voltage of the LDPMOS device.

9. The LDPMOS device as claimed in claim 6, wherein the semiconductor substrate is a P-type semiconductor substrate, and the epi-layer includes a high voltage N-well region enclosed by a high voltage P-well region.

10. The LDPMOS device as claimed in claim 9, wherein a surface of the high voltage P-well region includes a P+ heavily diffused region.

11. A lateral diffused N-type metal oxide semiconductor (LDNMOS) device with electrostatic discharge (ESD) protection capability, comprising:
    a semiconductor substrate with an epi-layer thereon;
    patterned isolations disposed on the epi-layer, thereby defining an active region;
    an N-type double diffused drain (NDDD) region formed in the active region;
    an $N^+$ heavily doped drain region disposed in the NDDD region;
    a neighboring pair of an $N^+$ heavily doped and a $P^+$ heavily doped source region disposed in the epi-layer; and
    a gate structure is disposed between the $N^+$ heavily doped source region and the $N^+$ heavily doped drain region,
    wherein an additional heavily doped region is formed between the semiconductor substrate and the epi-layer, and wherein a position of the additional heavily doped region is corresponding to a position of the NDDD region, and not the $N^+$ heavily doped and a $P^+$ heavily doped source region.

12. The LDNMOS device as claimed in claim 11, wherein the additional heavily doped region includes an $N^+$ heavily doped region or a $P^+$ heavily doped region.

13. The LDNMOS device as claimed in claim 11, wherein a breakdown voltage on an interface between the additional heavily doped region and the semiconductor substrate or the epi-layer is greater than a breakdown voltage of the LDNMOS device.

14. The LDNMOS device as claimed in claim 11, wherein the semiconductor substrate is an N-type semiconductor substrate, and the epi-layer includes a high voltage P-well region enclosed by a high voltage N-well region.

15. The LDNMOS device as claimed in claim 14, wherein a surface of the high voltage N-well region includes an $N^+$ heavily diffused region.

16. A lateral diffused P-type metal oxide semiconductor (LDPMOS) device with electrostatic discharge (ESD) protection capability, comprising:
    a semiconductor substrate with an epi-layer thereon;
    a buried layer disposed between the semiconductor substrate and the epi-layer;
    patterned isolations disposed on the epi-layer, thereby defining a first active region and a second active region;
    a P-type double diffused drain (PDDD) region formed in the first active region;
    a $P^+$ heavily doped drain region disposed in the PDDD region;
    an N-body diffused region formed in the second active region, wherein the PDDD region and the N-body diffused region are separated with a predetermined distance exposing the semiconductor substrate;
    a neighboring pair of an $N^+$ heavily doped and a $P^+$ heavily doped source region disposed in the N-body diffused region; and
    a gate structure is disposed between the $P^+$ heavily doped source region and the $P^+$ heavily doped drain region,
    wherein an additional heavily doped region is formed between the semiconductor substrate and the epi-layer.

17. The LDPMOS device as claimed in claim 16, wherein the buried layer is an N-type buried layer.

18. The LDPMOS device as claimed in claim 16, wherein a position of the additional heavily doped region is corresponding to a position of the PDDD region.

19. The LDPMOS device as claimed in claim 16, wherein the additional heavily doped region includes an $N^+$ heavily doped region or a $P^+$ heavily doped region.

20. The LDPMOS device as claimed in claim 16, wherein a breakdown voltage on an interface between the additional heavily doped region and the semiconductor substrate or the epi-layer is greater than a breakdown voltage of the LDPMOS device.

21. The LDPMOS device as claimed in claim 16, wherein the semiconductor substrate is a P-type semiconductor substrate, and the epi-layer includes a high voltage P-well region enclosed by a high voltage N-well region.

22. The LDPMOS device as claimed in claim 21, wherein a surface of the high voltage N-well region includes an $N^+$ heavily diffused region.

* * * * *